US011586573B2

(12) United States Patent
Reed et al.

(10) Patent No.: US 11,586,573 B2
(45) Date of Patent: Feb. 21, 2023

(54) DISTRIBUTED INPUT/OUTPUT (IO) CONTROL AND INTERLOCK RING ARCHITECTURE

(71) Applicant: Applied Materials, Inc., Santa Clara, CA (US)

(72) Inventors: James Robert Reed, Wimberley, TX (US); Kiyki-Shiy N. Shang, Mountain House, CA (US); Martin A. Jolivet, Austin, TX (US)

(73) Assignee: Applied Materials, Inc., Santa Clara, CA (US)

( * ) Notice: Subject to any disclaimer, the term of this patent is extended or adjusted under 35 U.S.C. 154(b) by 35 days.

(21) Appl. No.: 17/192,318

(22) Filed: Mar. 4, 2021

(65) Prior Publication Data
US 2021/0191895 A1 Jun. 24, 2021

Related U.S. Application Data

(60) Provisional application No. 63/198,861, filed on Nov. 18, 2020.

(51) Int. Cl.
*G06F 13/40* (2006.01)
*H01L 21/67* (2006.01)
(Continued)

(52) U.S. Cl.
CPC ....... *G06F 13/4027* (2013.01); *G05B 19/054* (2013.01); *H01L 21/6719* (2013.01);
(Continued)

(58) Field of Classification Search
CPC .............. G06F 13/4027; G05B 19/054; H04L 12/40013
See application file for complete search history.

(56) References Cited

U.S. PATENT DOCUMENTS 6,312,525 B1 * 11/2001 Bright ............... H01L 21/67196
204/298.25
8,966,028 B2 * 2/2015 Blair ....................... G06F 3/067
709/221
(Continued)

FOREIGN PATENT DOCUMENTS

JP          2000-349015          12/2000
WO          2014-090915          6/2014
WO          WO-2019217315 A1 *  11/2019  ......... G05B 19/0421

OTHER PUBLICATIONS

"EtherCAT Introduction and Overview," EtherCAT Technology Group, Oct. 2014, 95 pages.
(Continued)

*Primary Examiner* — Henry Tsai
*Assistant Examiner* — Christopher A Daley
(74) *Attorney, Agent, or Firm* — Lowenstein Sandler LLP (57) ABSTRACT

A system includes a programmable logic control (PLC) module, an input/output (IO) network bus coupled to the PLC module and provided at facets of a mainframe. A first process chamber attached to a first facet of the facets. A chamber interface IO sub-module is attached to the first facet and coupled to the IO network bus and to a process chamber IO controller of the first process chamber. The chamber interface IO sub-module is to: convert interlock relay signals, received via dry contact exchange with the process chamber IO controller, to digital signals; combine the digital signals into network packets adapted for communication using a protocol of the IO network bus; and transmit the network packets to the PLC module over the IO network bus.

20 Claims, 6 Drawing Sheets

(51) Int. Cl.
  *G05B 19/05*     (2006.01)
  *H04L 12/40*     (2006.01)
(52) U.S. Cl.
  CPC ............... *H04L 12/40013* (2013.01); *G05B 2219/1131* (2013.01); *H04L 2012/4026* (2013.01)

(56) References Cited

U.S. PATENT DOCUMENTS

| | | | |
|---|---|---|---|
| 10,191,458 B2 * | 1/2019 | Cunningham | G05B 19/042 |
| 2004/0143370 A1 * | 7/2004 | Lu | G05D 11/133 |
| | | | 700/282 |
| 2005/0066084 A1 * | 3/2005 | Benninger | G07B 17/00467 |
| | | | 710/62 |
| 2007/0021050 A1 * | 1/2007 | Kennedy | F24F 3/167 |
| | | | 454/187 |
| 2008/0061793 A1 | 3/2008 | Anwar et al. | |
| 2009/0171472 A1 * | 7/2009 | Teranisi | G05B 9/03 |
| | | | 700/79 |
| 2016/0077508 A1 | 3/2016 | Schauer | |

OTHER PUBLICATIONS

PCT Notification of Transmittal of The International Search Report and The Written Opinion of The International Searching Authority for PCT Application No. PCT/US2021/059575, dated Mar. 8, 2022, 11 pages.

* cited by examiner

DISTRIBUTED INPUT/OUTPUT (IO) CONTROL AND INTERLOCK RING ARCHITECTURE

RELATED APPLICATIONS

The present application claims priority to U.S. Provisional Patent Application No. 63/198,861 filed Nov. 18, 2020, and entitled "DISTRIBUTED INPUT/OUTPUT (IO) CONTROL AND INTERLOCK RING ARCHITECTURE," which is herein incorporated by this reference in its entirety.

TECHNICAL FIELD

Embodiments of the present disclosure relate to distributed input/output (IO) control and interlock ring architecture.

BACKGROUND

Next generation mainframes for semiconductor processing will grow in size and seek to add a high density of process chambers (e.g., up to ten or more on a mainframe), a high flexibility with any chamber type in any mainframe facet position, and to support up to a three mainframe cluster. A cluster is a collection of mainframes joined at a facet position, which can be either a mainframe-to-mainframe configuration or via a buffered volume similar to a load lock. For example, a connection volume, such as an aluminum body, is referred to as a via and can couple the mainframes together. Current IO controls for such mainframes distribute high density discrete interlock and IO signals to platform modules, including process chambers, load locks, mainframe remotes, and additional mainframes.

Current controls architecture, however, supports a limited number of process chambers, such as 2, 4, 6, or 8 process chambers via mainframe IO controllers. Further, current IO control, to include transmission of the discrete interlock and IO signals, is implemented using cables and harnesses made up of connectors and discrete wires originating from a centralized mainframe IO controller. Further, clean dry air (CDA) supply lines are poly cables that originate from air regulators to centralized air manifolds for driving devices over smaller poly cable branches for each mainframe. These IO control and CDA cables are run to each facet of the mainframe regardless of whether process chambers are attached to the facets, resulting in a high density of long IO control wires and CDA supply lines that are expensive and take up significant space in a processing fab. For example, for an entire mainframe, a multi-conductor cable is extended to all of the process chambers to carry control to each slit valve (SV) position. Further, a longer, thick cable for IO control is extended to a remote area that costs two thousand dollars just for the cable.

SUMMARY

Some of the embodiments described herein covers a system including a programmable logic control (PLC) module. The system further includes an input/output (IO) network bus coupled to the PLC module and provided at a plurality of facets of a mainframe. The system further includes a first process chamber attached to a first facet of the plurality of facets. The system further includes a chamber interface IO sub-module attached to the first facet and coupled to the IO network bus and to a process chamber IO controller of the first process chamber. The chamber interface IO sub-module is to: convert interlock relay signals, received via dry contact exchange with the process chamber IO controller, to digital signals; combine the digital signals into network packets adapted for communication using a protocol of the IO network bus; and transmit the network packets to the PLC module over the IO network bus.

In related embodiments, described herein is a slit valve assembly including a slit valve having a position sensor. The assembly further includes an electro-valve (EV) manifold including an EV coupled to the slit valve and a clean dry air (CDA) poly line coupled to the EV manifold and to be coupled to a CDA supply ring of a mainframe. The assembly further includes a chamber interface input/output (IO) sub-module coupled to the position sensor, the EV manifold, and to be coupled to an IO network bus of the mainframe. The chamber interface IO sub-module is to: relay a position value of the slit valve from the position sensor, over the IO network bus, to a programmable logic control (PLC) module of the mainframe; and relay a control signal, received over the IO network bus from the PLC module, to the EV manifold to control slit valve pneumatics via the EV.

In a further embodiment, described herein is a system including a first safety programmable logic control module (PLC module) having multiple local input/output (IO) ports and a first interlock bus port. The system further includes a first single local IO bus coupled to a first local IO port of the multiple local IO ports. The system further includes multiple IO sub-modules coupled to the first single local IO bus. Each IO sub-module of the multiple IO sub-modules is to send control signals to the first safety PLC module over the first single local IO bus. The system further includes a second safety PLC module including multiple local IO ports and a second interlock bus port. The system further includes an interlock connector to couple the first interlock bus port to the second interlock bus port over an interlock bus.

Numerous other features are provided in accordance with these and other embodiments of the disclosure. Other features and embodiments of the present disclosure will become more fully apparent from the following detailed description, the claims, and the accompanying drawings.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Embodiments described herein are related to systems and methods for distributed input/output (IO) control and interlock ring architecture. To resolve the above discussed deficiencies in the current architecture and to support a high density of process chambers (up to 10 or more on a mainframe (MF)), a high flexibility in positioning those process chambers, and the clustering of mainframes, the present disclosure discloses modularization of the IO control in a point-of-use (POU) implementation. This POU implementation can include a slit valve assembly that is selectively removable from a facet, and thus only need be employed in the presence of a process chamber. The slit valve assembly can include a chamber interface IO sub-module that can be placed at any facet, relay slit valve position values to a programmable logic control (PLC) module of the MF, relay slit valve control signals from the PLC module to pneumatics of the slit valve, and execute emergency off (EMO) and chamber interlocks handshakes between dry contact exchanges on the process chamber side and an IO network bus on a transfer chamber side. Dry contact exchange can refer to a secondary set of contacts of a rely circuit that does not make or break the primary current being controlled by the relay, do not use power and are thus passive and isolated from sources of power.

Making the slit valve assembly selectively removable depending on whether a process chamber is present reduces core mainframe costs, supports any number of chambers, and does so without impacting mainframe controls. The removable slit valve assembly also facilitates adding and removing process chambers on-the-fly, incorporating high flexibility in MF architecture without adding long cables to expand the MF architecture. Additional or different advantages will be apparent to those of ordinary skill in the art as explained with reference to the present figures, which will be specifically discussed herein.

More specifically, the chamber interface IO sub-module of each silt valve assembly can be selectively connected to a single network IO bus (e.g., network cable) that is coupled to the PLC module of the mainframe. To do so, the network IO bus can include at least one network connector (such as a network bus T-connector or switch, for example) located at each facet of the mainframe. Further, a clean dry air (CDA) supply ring, coupled to a CDA regulator, can be positioned around a perimeter of the mainframe and include CDA quick disconnects located at the facets. In this way, each slit valve assembly at any given facet can be selectively coupled between a network connector of the network IO bus and the process chamber, assuming the process chamber is attached to the MF. Similarly, the slit valve assembly can be coupled between a CDA quick disconnect of the CDA supply ring and the process chamber, if attached. This modular approach enables flexible attachment of a large number of process chambers along the network IO bus and the CDA supply ring without previous limits related to cable density, expense, and control limits. If a process chamber is not attached, the slit valve assembly is unnecessary and thus its expense not required.

In various embodiments, the slit valve assembly includes a slit valve (or a dual slit valve) with a position sensor. The slit valve assembly further includes an electro-valve (EV) manifold that includes at least one EV coupled to the slit valve. A CDA supply line is coupled to the EV manifold and is to be coupled to a CDA supply ring of the mainframe, which was just discussed. A chamber interface IO sub-module can be provided that is coupled to the position sensor, the EV manifold, and that is to be coupled to the IO network bus. The chamber interface IO sub-module can be adapted to relay a position value of the slit valve from the position sensor, over the IO network bus, to a programmable logic control (PLC) module of the mainframe. The chamber interface IO sub-module can further be adapted to relay a control signal, received over the IO network bus from the PLC module, to the EV manifold to control slit valve pneumatics by driving the EV. Additional functionality of the chamber interface IO sub-module will be discussed. The slit valve assembly can also include a control cable coupled between the position sensor and the chamber interface IO sub-module and a network connector between the process chamber IO controller and the network connector.

In some embodiments, the chamber interface IO sub-module can also include an interlock cable connector that is to be coupled to a process chamber IO controller, which includes a number of interlock relays and IO relays. Interlocks are features that make the state of two mechanisms or functions mutually dependent, and are used to prevent undesired states in a finite state machine, for example. Interlocks can include any or a combination of electrical, electronic, or mechanical devices and systems. The chamber interface IO sub-module can further perform an interlock handshake with the PLC module over the IO network bus. For example, the chamber interface IO sub-module can convert interlock relay signals, received via dry contact exchange with the process chamber IO controller, to digital signals. The chamber interface IO sub-module can further combine the digital signals into network packets adapted for communication using a protocol of the IO network bus. The chamber interface IO sub-module can further transmit the network packets to the PLC module over the IO network bus.

In one embodiment, the interlock handshape enables communication via a safety PLC protocol such as Ethernet for Control Automation Technology (EtherCAT) over the IO network bus, at which point the communication can resume over an interlock bus or an EtherCAT network. This extension of the interlock network over the IO network bus obviates the need for separate longer relays run to interlocks at the mainframes from the PLC module.

Further, in related embodiments, the PLC module for the mainframe can be coupled to a second PLC module of a second mainframe using safety PLC protocols over an interlock bus. In embodiments, the PLC module can include a first interlock bus port and the second PLC module include a second interlock bus port. The system can further include an interlock connector (such as an interlock bus T-connector) to couple the first interlock bus port to the second interlock bus port over an interlock bus. In this way, interlocks of the PLC module and the second PLC module can intercommunicate over the interlock bus. The information communicated over the interlock bus can be, for example, information of different moving parts (such as slit valves), processing components that are to be safety checked in order to allow these movements to occur, and control signals that are to cause movement of the moving parts. This information may also need to be shared to and from a remote area.

In the related embodiments, the PLC module includes a first EtherCAT-in port coupled to an EtherCAT master device over a first EtherCAT network cable and a first EtherCAT-out port. The second PLC module includes a second EtherCAT-in port coupled to the first EtherCAT-out port over a second EtherCAT network cable. The second PLC module can then send a safety control signal to the process chamber IO controller over the second EtherCAT network cable and via the PLC module. In this way, safety signals can also be transmitted over the EtherCAT network between PLC modules of clustered mainframes.

Figure 1:
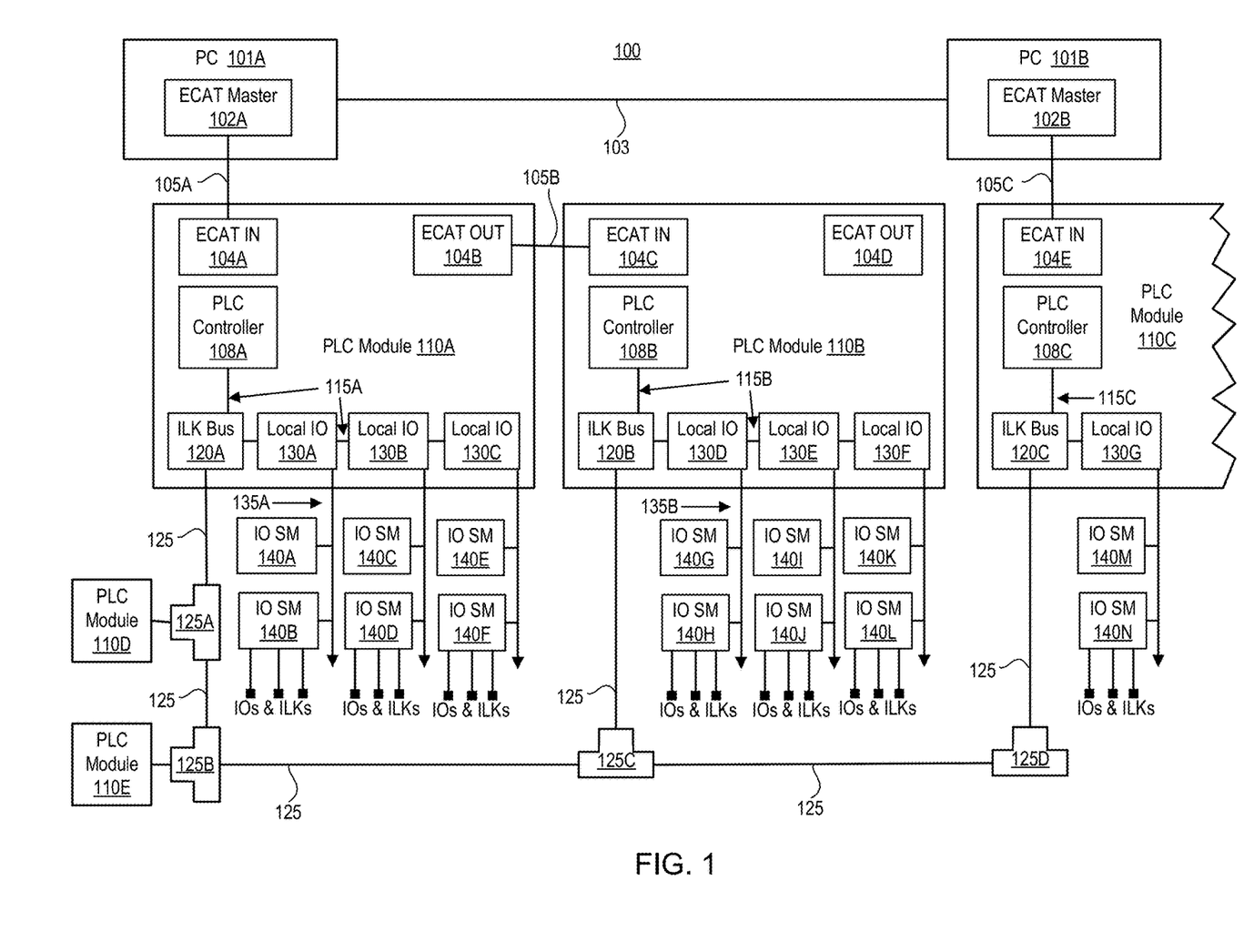
FIG. 1 is a block diagram of a distributed master-slave safety control system according to various embodiments.

FIG. 1 is a block diagram of a distributed master-slave safety control system 100 (or more simply referred to as system 100) according to various embodiments. The system 100 can enable the high density and flexibility of process chambers attached to a mainframe, as discussed previously, and will therefore be discussed in some detail. In some embodiments, the system 100 includes computing device 101A and 101B, each containing an EtherCAT master controller 102A and 102B, respectively. These computing devices 101A and 101B can be host computing systems or devices, also referred to herein as EtherCAT master devices, that communicate over a personal computer (PC) tool network 103. The system 100 can further include PLC modules 110A, 110B, 110C, 110D, 110E, which can be safety PLC modules adapted with safety communication protocols such as EtherCAT, and each of which can control a separate machine or system. Each PLC module can be implemented as a single chip or on a single control board or the like. The system 100 can further include a number of IO sub-modules 140A . . . 140N that interface with or control different IO devices and interlocks. The system 100 can support different types of buses and networks for communication as will be discussed.

In some embodiments, each of the PLC modules 110A . . . 110E is an integrated EtherCAT IO controller for embedded machine control applications. Example applications include automation of semiconductor and photovoltaic wafer fabrication tools, metrology systems, and medical manufacturing equipment. These PLC modules offer high channel count, hardware interlocks, and EtherCAT connectivity in one package. The IO sub-modules 140A . . . 140N are extremely fast IO subsystems configured to support customer-specified sensors and actuators throughout the controller equipment and are available in various sizes.

Further, the PLC modules 110A . . . 110E complement an EtherCAT network by providing fail-safe, hardware-based interlocks and high-speed embedded control. Hundreds of mixed-signal inputs and outputs can be simultaneously controlled and monitored with sub-millisecond response times. The EtherCAT host computing devices 101A and 101B are thus unburdened from high speed control sequencing, interlocks, and data collection tasks.

In addition, the system 100 can parse through collected data and notify the computing devices 101A and 101B when certain thresholds are reached. Event timing is synchronized with an EtherCAT clock to maintain a high degree of simultaneity with low jitter. Interlocks, which can be implemented using Field Programmable Gate Array (FPGAs) or other programmable processors, can be reconfigured, virtually eliminating hardware design spins usually required to accommodate process changes.

In various embodiments, a first PLC module 110A includes a first EtherCAT-in port 104A that is coupled to the EtherCAT master controller 102A over an EtherCAT network cable 105A and includes a first EtherCAT-out port 104B. Further, a second PLC module 110B includes a second EtherCAT-in port 104C and a second EtherCAT-out port 104D. The first EtherCAT-out port 104B can be coupled to the second EtherCAT-in port 104C over an EtherCAT network cable 105B. Further, a third PLC module 110C can include a third EtherCAT-in port 104E to be coupled to the EtherCAT master controller 102B over an EtherCAT network cable 105C. In this way, the three PLC modules 110A, 110B, and 110C are coupled to each other over an EtherCAT network for EtherCAT protocol communication.

In some embodiments, the first PLC module 110A includes a first PLC controller 108A, the second PLC module 110B includes a second PLC controller 108B, and the third PLC module 110C includes a third PLC controller 108C. Each of these PLC controllers 108A, 108B, and 108C can include logic for communicating control (e.g., to control IO devices) using one or more safety protocols over an interlock bus 125, local bus connections 115A, 115B, and 115C, respectively, and over a local IO bus 135A, 135B, and 135C, respectively.

More specifically, in these embodiments, the first PLC module 110A includes an interlock bus port 120A that is coupled to the first PLC controller 108A and through which communication with other interlocks, networks, and IO sub-modules is made possible. For example, the interlock bus port 120A can be serially coupled to local IO ports 130A, 130B, and 130C over a local bus 115A. Each local IO port 130A, 130B, and 130C is connected to a local IO bus 135A to which is coupled two or more IO sub-modules 140A, 140B and 140C, 140D and 140E, 140F, respectively.

In disclosed embodiments, the second PLC module 110B includes an interlock bus port 120B that is coupled to the second PLC controller 108B. The interlock bus port 120B can be serially coupled to local IO ports 130D, 130E, and 130F over a local bus 115B. Each local IO port 130D, 130E, and 130F is connected to a local IO bus 135A to which is coupled two or more IO sub-modules 140G, 140H and 140I, 140J and 140K, 140L, respectively. Further, in these embodiments, the third PLC module 110C includes an interlock bus port 120C that is coupled to the third PLC controller 108C. The interlock bus port 120C can be serially coupled to at least three local IO ports, of which only local IO port 130G is illustrated for simplicity, over a local bus 115C. The local IO port 130G can be coupled to two or more IO submodules 140M, 140N. In these embodiments, each of the sub-modules can be adapted to control one or more IO devices and one or more interlocks of a machine or other system.

In this way, a local IO port is coupled to multiple IO sub-modules over a single IO bus. The multiple sub-modules can be expanded to many more than two and the single IO bus can be implemented as a network bus, such as, for example, an Ethernet cable having inline network connectors (such as network bus T-connectors or the like) to make parallel connections to the multiple sub-modules. The expansion to multiple sub-modules means the limit of three local IO ports does not overly limit the number of sub-modules that can be controlled by the first PLC module 110A. Further, one of the local IO ports of each PLC module can be adapted as an interlock bus port.

In various embodiments, therefore, the interlock bus ports 120A, 120B, and 120C and those of a fourth PLC module 110D and a fifth PLC module 110E can be coupled together over an interlock bus 125 via interlock connectors 125A, 125B, 125C, and 125D. These interlock connectors can be interlock bus T-connectors or the like that facilitate parallel coupling of these multiple PLC modules 110A . . . 110E to a single interlock bus, e.g., the interlock bus 125. In this way, the reach of the interlock bus 125 for PLC safety communication among the multiple PLC modules 110A . . . 110E is greatly expanded. Interlock handshakes from the IO sub-modules can also be put onto the interlock bus 125 from a local IO port and thus be passed between the multiple PLC modules in this way.

The embodiments illustrated in the system 100 of FIG. 1 thus improve upon existing systems, where now a single interlock bus port or local IO port is able to connect to multiple nodes for safety control purposes of a machine. Further, the flexible network topologies with IO control (IOC) sub-modules and safety PLC modules are made possible by being coupled to the same bus, e.g., the local IO bus 135A. Additionally, data bandwidth is limited only by the interlock/IO bus protocol being employed. Furthermore, the system 100 can accept new network nodes without reconfiguring the PLC module or the interlocks bus or local IO ports.

In one embodiment, the system 100 includes the first safety programmable logic control (PLC) module 110A, which includes multiple local input/output (IO) ports 130A . . . 130C and a first interlock bus port 120A. The system 100 further includes a first single local IO bus 135A coupled to a first local IO port 130A of the multiple local IO ports and multiple IO sub-modules 140A and 140B coupled to the first single local IO bus 135A. Each IO sub-module of the multiple IO sub-modules is to send control signals to the first safety PLC module 110A over the first single local IO bus 135A. The second safety PLC module 110B includes multiple local IO ports 130D . . . 130F and a second interlock bus port 120B. An interlock connector 125C is to couple the first interlock bus port 120A to the second interlock bus port 120B over the interlock bus 125.

In furtherance of this embodiment, the multiple IO sub-modules include a first set of IO sub-modules 140A, 140B of a first machine. The system 100 can include a second single local IO bus 135B coupled to a second local IO port, e.g., local IO port 130D, of multiple local IO ports of the second safety PLC module 110B. A second set of IO sub-modules 140G, 140H of a second machine can be coupled to the second single IO bus 135B. Further, the first PLC controller 108A of the first safety PLC module 110A can control the first set of IO sub-modules 140A, 140B over the first single local IO bus 125 and control the second set of IO sub-modules 140G, 140H over the interlock bus 125 and the second single local IO bus 135B. Additionally, the second PLC controller 108B of the second safety PLC module 110B is to control the second set of IO sub-modules 140G, 140H over the second single local IO bus 135B and control the first set of IO sub-modules 140A, 140B over the interlock bus 125 and the first single local IO bus 135A.

In an additional embodiment, the first safety PLC module 110A includes the first EtherCAT-in port 104A coupled to a EtherCAT master device (e.g., the computing device 101A) over a first EtherCAT network cable 105A. The first safety PLC module 110A can also include the first EtherCAT-out port 104B. The second safety PLC module 110B can include the second EtherCAT-in port 104C coupled to the first EtherCAT-out port 104B over the second EtherCAT network cable 104B. The second PLC controller 108B of the second safety PLC module 110B can be adapted to send a safety control signal to one of the first set of IO sub-modules 140A, 140B of the first machine over the second EtherCAT network cable 105B.

Figure 2:
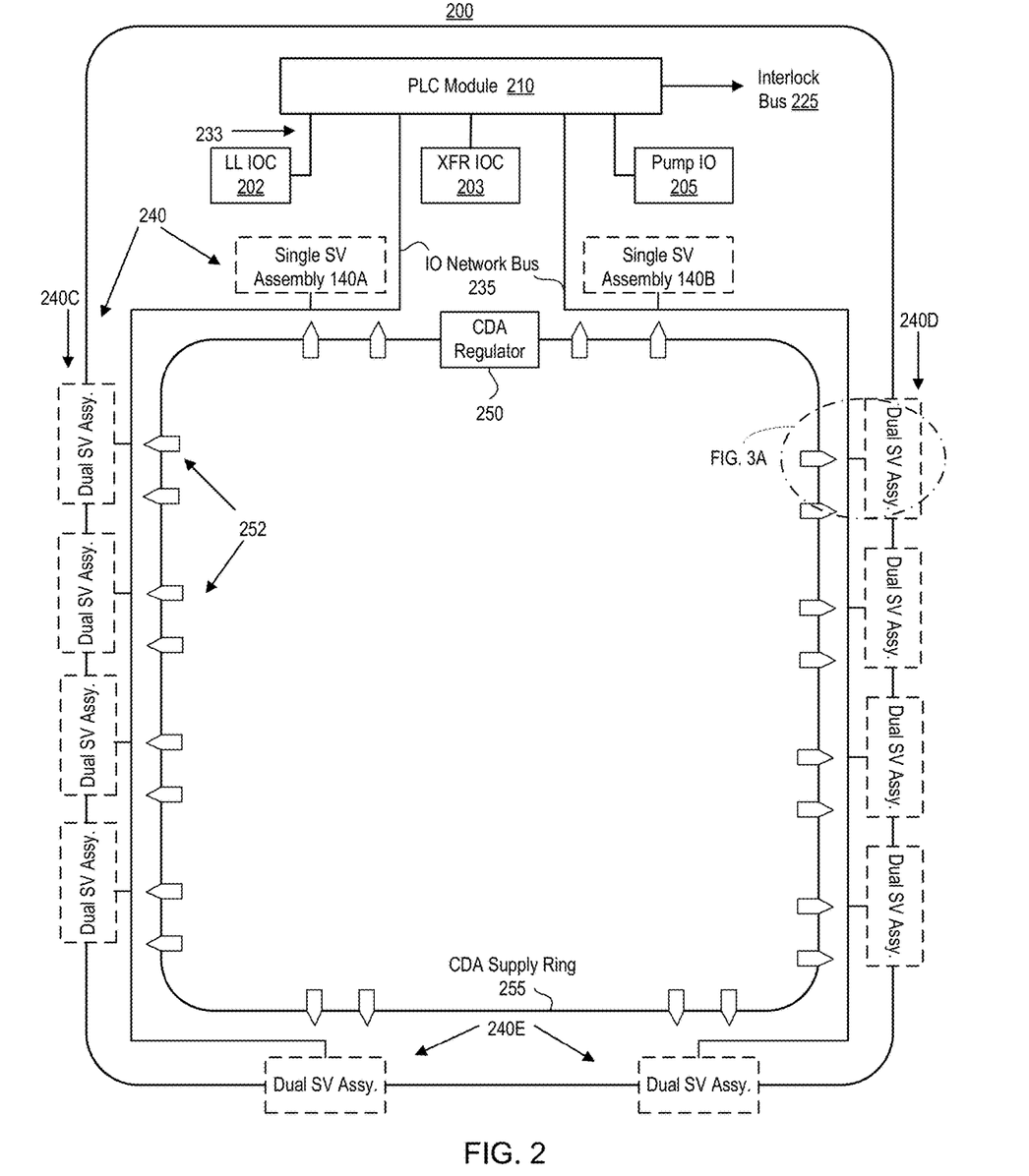
FIG. 2 is a block diagram of a distributed control architecture for a mainframe according to an embodiment.

FIG. 2 is a block diagram of a distributed control architecture 200 for a mainframe according to an embodiment. In various embodiments, the distributed control architecture 200 includes a PLC module 210 coupled to an interlock bus 225. The PLC module 210 can represent any of the PLC modules 110A . . . 110E discussed with reference to FIG. 1.

The PLC module 210 can be coupled to a number of IO sub-modules over local IO buses 233 and which include, for example, a load lock IO controller 202 coupled to the PLC module 210 over a first local IO bus, a transfer chamber IO controller 203 coupled to the PLC module 210 over one of the first or a second local IO bus, and/or a pump IO 205 coupled to the PLC module over one of the first, the second, or a third local IO bus. A number of additional sub-modules can be attached to the PLC module 210 that are not illustrated, but can include a load lock heater, an integrated mass flow system (iMFS), a point-of-use (POU) pump, a via slit valve, and remote control switch and the like, each of which can include IO control logic. In one embodiment, an iMFS is a collection of controls and plumbing intended for gas flow verification used for improved chamber matching. Each sub-module can include a sub-module IO controller that includes the IO control logic and that is coupled to the corresponding sub-module.

The distributed control architecture 200 further includes an input/output (IO) network bus 235 coupled to the PLC module 210 and provided at a plurality of facets, e.g., for parallel connections to a number facets of the mainframe, which are not illustrated for simplicity. In one embodiment, the IO network bus 235 is a single network cable (e.g., an Ethernet cable) to which is attached a number of network connectors, at least one for each of the facets. In different embodiments, the connectors are network bus T-connectors, multi-way connectors, or simple switches or hubs. Thus, in one embodiment, the IO network bus 235 is a single Ethernet cable to which is attached multiple network bus T-connectors, at least one of which is located at each of the facets of the mainframe. The IO network bus 235 can be arranged in a circle, as illustrated, in one embodiment. In another embodiment, the IO network bus 235 is split in two, where each is a way-one network cable positioned around half of the mainframe.

In various embodiments, the distributed control architecture 200 can further include multiple slit valve (SV) assemblies 240 attached to the network connectors along the IO network bus 235. While boxes are illustrated for these multiple SV assemblies, advantageously, SV assemblies are selectively coupled only to facets to which a processing (or other type) of chamber is attached. Thus, the multiple SV assemblies are illustrated in dashed line to indicate being optional. In this way, the expense and space required for the SV assemblies is reserved for when one or more of the SV assemblies 240 are needed, not for all facets at all times.

In these embodiments, the SV assemblies 240 include at least a first single SV assembly 240A and a second single SV assembly 240B and one or more dual SV assemblies. The dual SV assemblies 240 can include a first group of dual SV assemblies 240C along one side of the mainframe, a second group of dual SV assemblies 240D along an second side of the mainframe opposite from the first side, and a third group of SV assemblies 240E along a third side of the mainframe which, for example, is attached between the first and second sides.

Figure 3A:
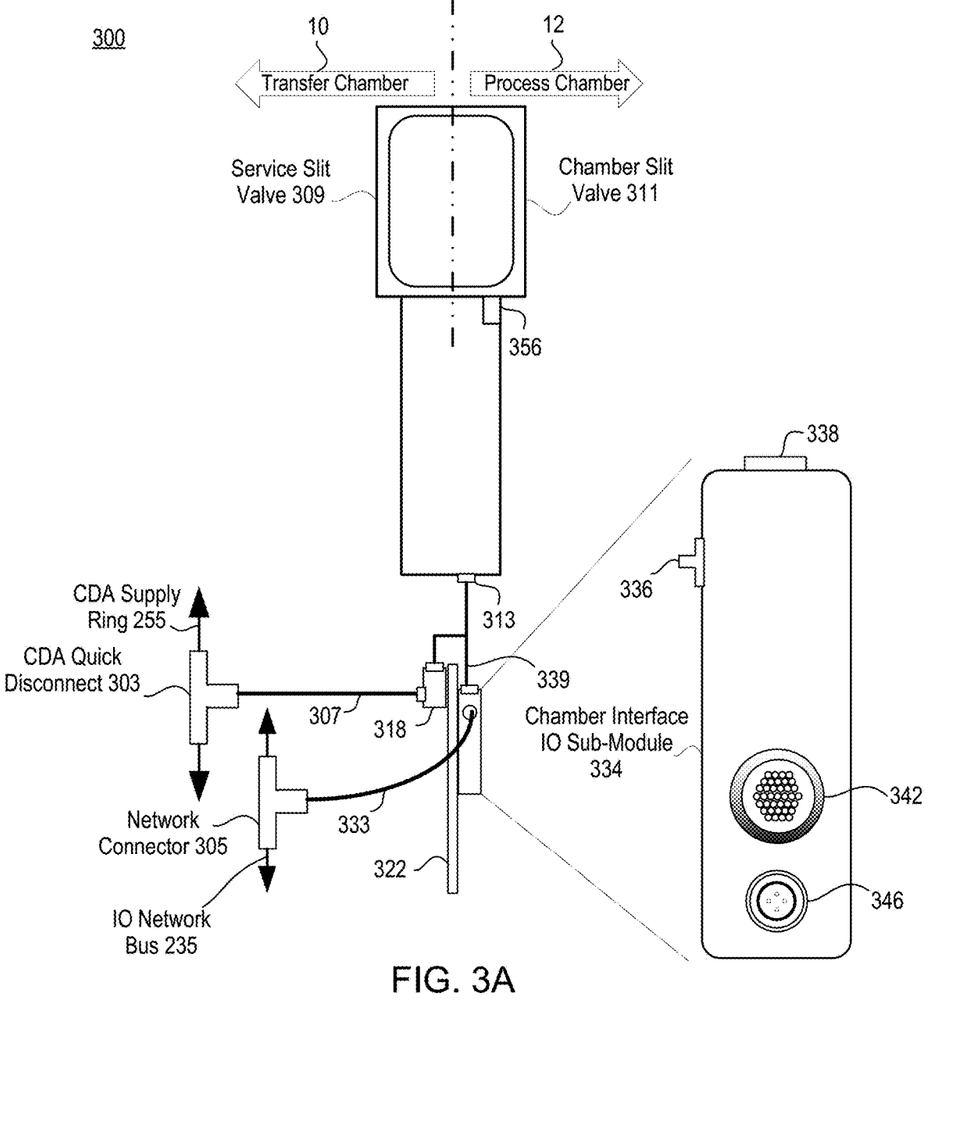
FIGS. 3A-3B are a block diagram of a dual slit valve assembly according to an embodiment.

In some embodiments, distributed control architecture 200 further includes a clean drive air (CDA) regulator 250 attached to a CDA supply ring 255, which is positioned around a perimeter of the mainframe and can be a long poly cable. The CDA regulator 250 supply can maintain a constant pressure of the CDA in the CDA supply ring 255. In one embodiment, the CDA supply ring 255 is a continuous (e.g., unbroken) pneumatic line around the perimeter of the mainframe. The CDA supply ring 255 can include a number of CDA quick disconnects 252 located at the facets of the mainframe. A CDA quick disconnect of the CDA quick disconnects 252 can be coupled to each SV assembly that is deployed within the architecture 200, as will be discussed in more detail with reference to FIG. 3.

Figure 3B:
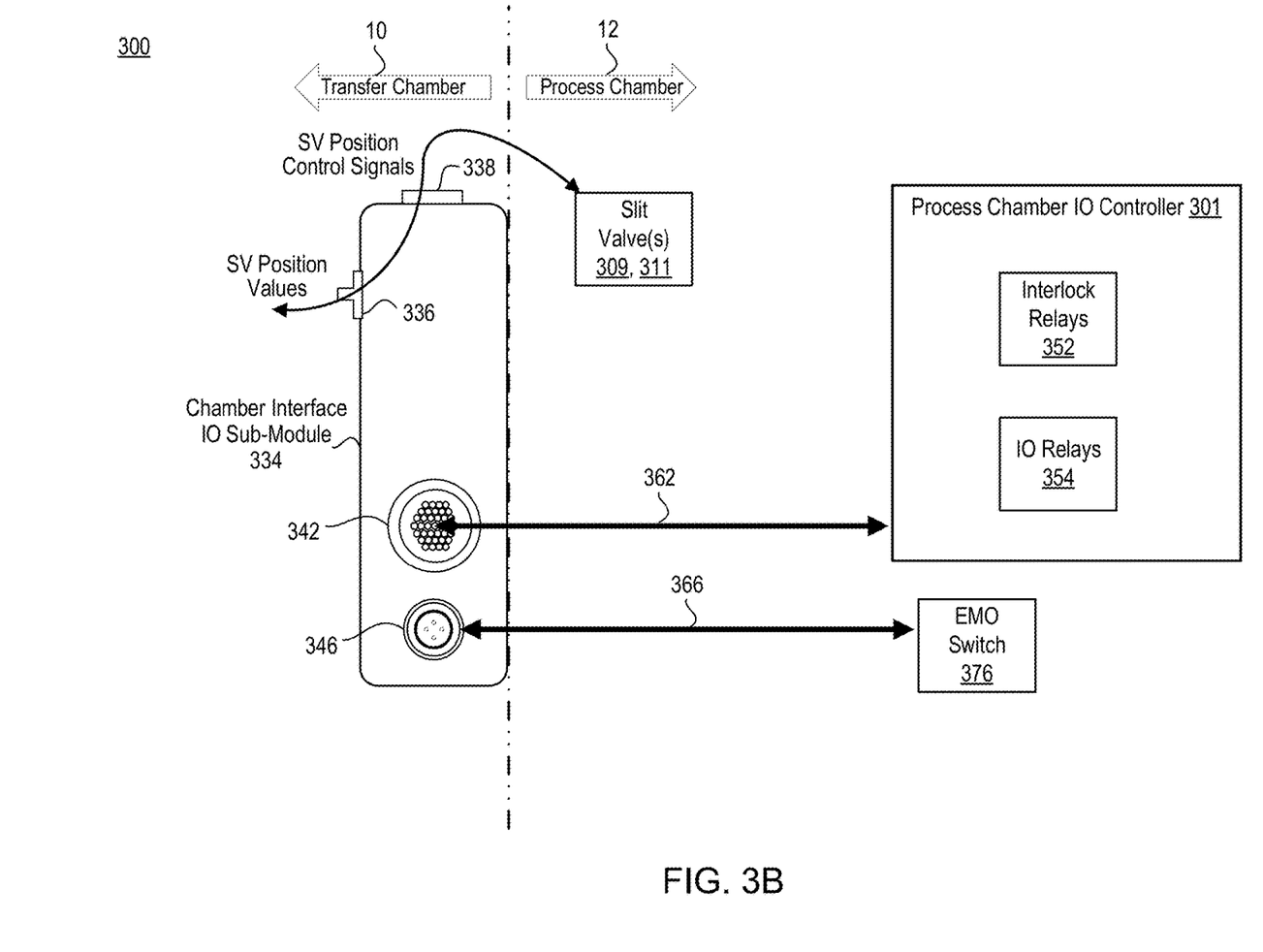

FIGS. 3A-3B are a block diagram of a dual slit valve (SV) assembly 300 according to an embodiment. The dual SV assembly 300 includes a service slit valve (SV) 309 on the side of a transfer chamber 10 and a chamber slit valve (SV) 311 on a side of a process chamber 12 of the mainframe (MF), e.g., such as that illustrated in FIG. 2. While FIG. 3 discloses a dual SV assembly, FIG. 3 is also representative of a single SV assembly should the service slit valve 309 be removed. Further, the architecture 200 can further include additional slit valve assemblies coupled to additional facets, of the multiple facets, at which additional process chambers attached to the mainframe, as was discussed with reference to FIG. 2. Each of the service SV 309 and the chamber SV 311 can include a position sensor 313 that detects a position of the slit valve, e.g., up or down or opened or closed, and transmits slit valve sensor signals to a chamber interface IO sub-module 334.

In various embodiments, the dual SV assembly 300 further includes an electro-valve (EV) manifold 318 coupled to a CDA quick disconnect 303 of the CDA supply ring 255, e.g., via a CDA poly line 307. The EV manifold 318 can include, for example, four EVs and thus be a four-position EV manifold. The EV manifold 318 can therefore include a first pair of EVs to drive the service SV 309 in up and down positions with the CDA from the CDA poly line 307 and a second pair of EVs to drive the chamber SV 311 in up and down positions with the CDA from the CDA ploy line 307. The clean dry air supplied via the CDA supply ring 255 can be pressurized to provide the force necessary to drive the slit valves.

In various embodiments, the dual SV assembly 300 further includes the chamber interface IO sub-module 334 coupled to the EV manifold 318 and to the IO network bus 235. For example, the chamber interface IO sub-module 334 can be connected to a network connector 305 that is attached to the IO network bus 235, e.g., via a network drop cable 333. Thus, the network drop cable 333 is coupled between the chamber interface IO sub-module 334 and the network connector 305. The network connector 305 can be a network bus T-connector, multiple-port connector, a switch, hub, or the like. The EV manifold 318 and the chamber interface IO sub-module 334 can be attached to a facet portion 322, for example, of one of the facets of the mainframe.

In some embodiments, the chamber interface IO sub-module 334 is to relay a position value of the slit valve (either the chamber slit valve 311 or the service slit valve 309) from the position sensor 313, over the IO network bus 235, to the programmable logic control (PLC) module 210 of the mainframe. The chamber interface IO sub-module 334 can also perform a further interlock handshake of interlock relay signals. In some embodiments, the chamber interface IO sub-module 334 is further to relay a control signal, received over the IO network bus 235 from the PLC module 210, to the EV manifold 318 to control slit valve pneumatics by driving one or more EV of the EV manifold 318. More specifically, this control signal can cause the one or more EV of either the chamber slit valve 311 or the service slit valve 309 to one of move up or down, e.g., opened or closed. In additional embodiments, the PLC module 210 can send different control signals for other IO sub-system or device to the process chamber 12 by way of dry contact exchange through the chamber interface IO sub-module 334.

In this way, the chamber interface IO sub-module 334 facilitates sending sensor data (e.g., position values) and other digital input values to the PLC module 210, which can centralize sensor data and digital input values from all the processing chambers in the mainframe. Based on this sensor data and digital input values and other interlock actions taking within the system 100, the PLC module 210 can control the chamber slit valve 311 (or other IO device or system) via control signals sent by way of the chamber interface IO sub-module 334. These control signals can also be transmitted via dry contact exchange within the chamber interface IO sub-module 334.

In various embodiments, the chamber interface IO sub-module 334 includes a network connector 336 that attaches to the network drop cable 333. The IO sub-module 334 can further include an SV interface connector 338 that is coupled to a control cable 339, which is attached to the EV manifold 318 and the position sensor 313. With additional reference to FIG. 3B, the chamber interface IO sub-module 334 can further include an interlock cable connector 342 that is to be attached to a multiline discrete interlock cable 362, which in turn is coupled to a process chamber IO controller 301 of the process chamber 12. The chamber interface IO sub-module 334 is further to perform an interlock handshake with the PLC module 210 over the IO network bus 235. In an alternative embodiment, the chamber interface IO sub-module 334 performs an interlock handshake with a second PLC module over the interlock bus 225 coupled between the PLC module 210 and a second PLC module of a second mainframe, for example.

With additional specificity, the process chamber IO controller 301 includes a number of interlock relays 352 and IO relays 354. The interlock relays 352 can, for example, couple to a number of interlocks associated with the process chamber 12 and its substrate processing. The IO relays 354 can, for example, be coupled to a number of IO devices or systems located at the process chamber 12 and associated with substrate processing performed in the process chamber 12. To perform the interlock handshake with the PLC controller 210, the chamber interface IO sub-module 334 can convert interlock relay signals, received via dry contact exchange with the process chamber IO controller 301, to digital signals. These dry contact exchange signals can come from either or both of the interlock relays 352 or the IO relays 354, for example. The chamber interface IO sub-module 334 can then combine the digital signals into network packets adapted for communication using a protocol of the IO network bus, e.g., Ethernet/IEEE 802.3, Token Ring/IEEE 802.5, Fiber Distributed Data Interface (FDDI), or the like. The chamber interface IO sub-module 334 can further transmit the network packets to the PLC module 210 over the IO network bus 235.

In related embodiments, the chamber interface IO sub-module 334 reverses this process in receipt of digital signals within network packets received over the IO network bus 235, and converting the digital signals to interlock relay signals. The chamber interface IO sub-module 334 can perform a dry contact exchange of the interlock relay signals with the interlock relays 352 and the IO relays 354 of the process chamber IO controller 301.

In some embodiments, the chamber interface IO sub-module 334 further includes an interface connector 346 that is to be attached to an emergency off (EMO) cable 366, which in turn is coupled to an EMO switch 376 of the mainframe. The EMO switch 376 can be a mechanical switch, which can include a button or other actuator to flip or toggle the mechanical switch to generate a dry contact EMO signal to be sensed at the chamber interface IO sub-module 334. The chamber interface IO sub-module 334 can convert an EMO signal, received via dry contact exchange with the EMO switch 376, to a digital EMO signal. The chamber interface IO sub-module 334 can further convert the digital EMO signal into a network packet adapted for communication using a protocol of the IO network bus 325. The chamber interface IO sub-module 334 can further send the network packet to the PLC module 210. In this way, the chamber interface IO sub-module 334 can perform a similar handshake with respect to the EMO switch 376 as performed for the interlock and IO relays. In response to receipt of the EMO signal, the PLC module 210 can shut down the entire mainframe processing in order to address the reason for the emergency shutoff before resuming processing.

In further embodiments, the chamber SV 311 includes a pressure regulator 356 coupled to and for changing the CDA pressure of the chamber SV 311. This pressure regulator 356 is designed to control the pressure at the chamber SV 311 seal to help extend the life of an O-ring (or other seal) and reduce particles at the seal of the chamber SV 311. In these embodiments, the chamber interface IO sub-module 334 outputs a dual pressure SV control signal to the pressure regulator 356 to one of increase or decrease pressure to the chamber SV 311.

Figure 4A:
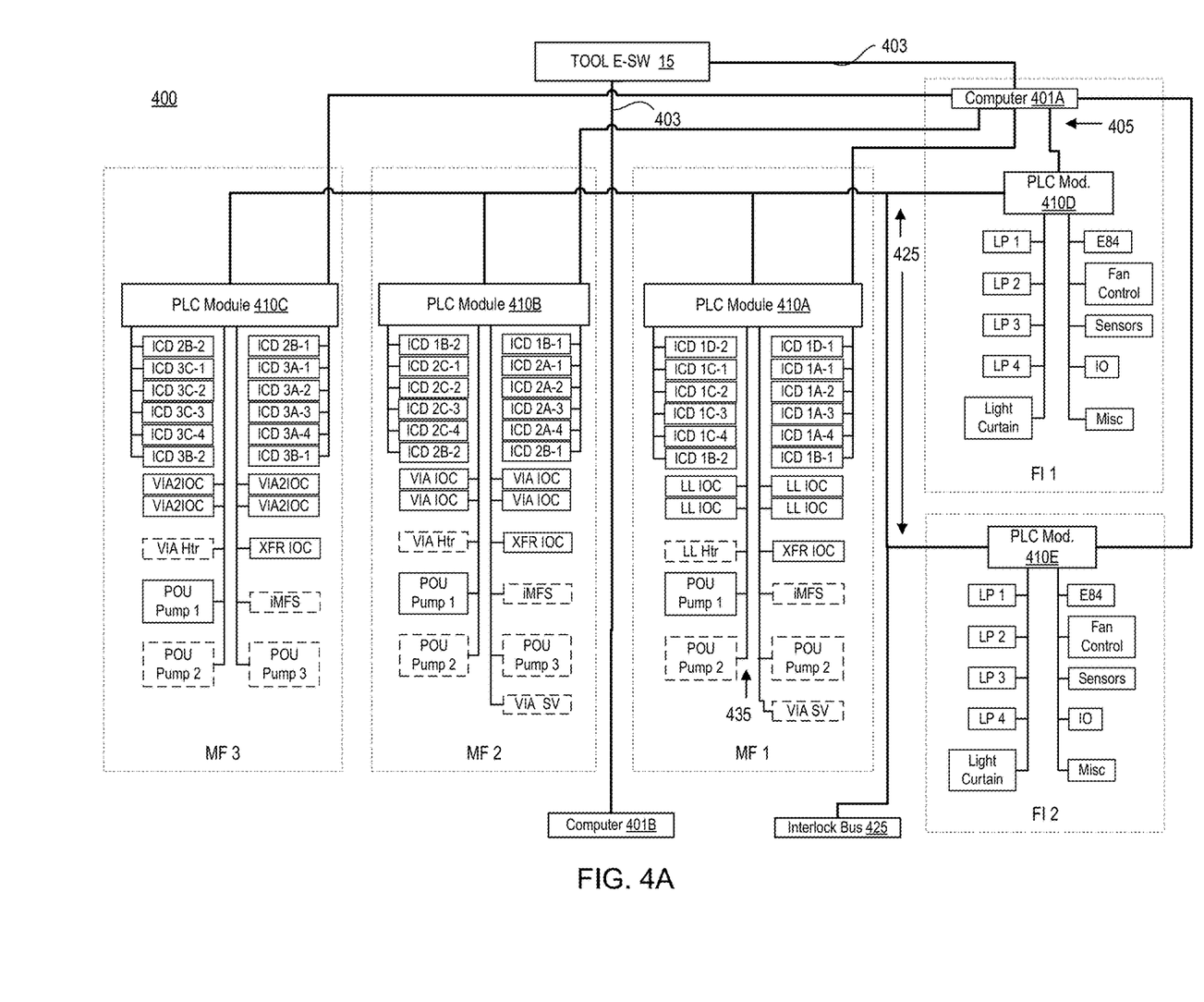
FIG. 4A is a block diagram of a distributed control and interlock architecture according to various embodiments.
Figure 4B:
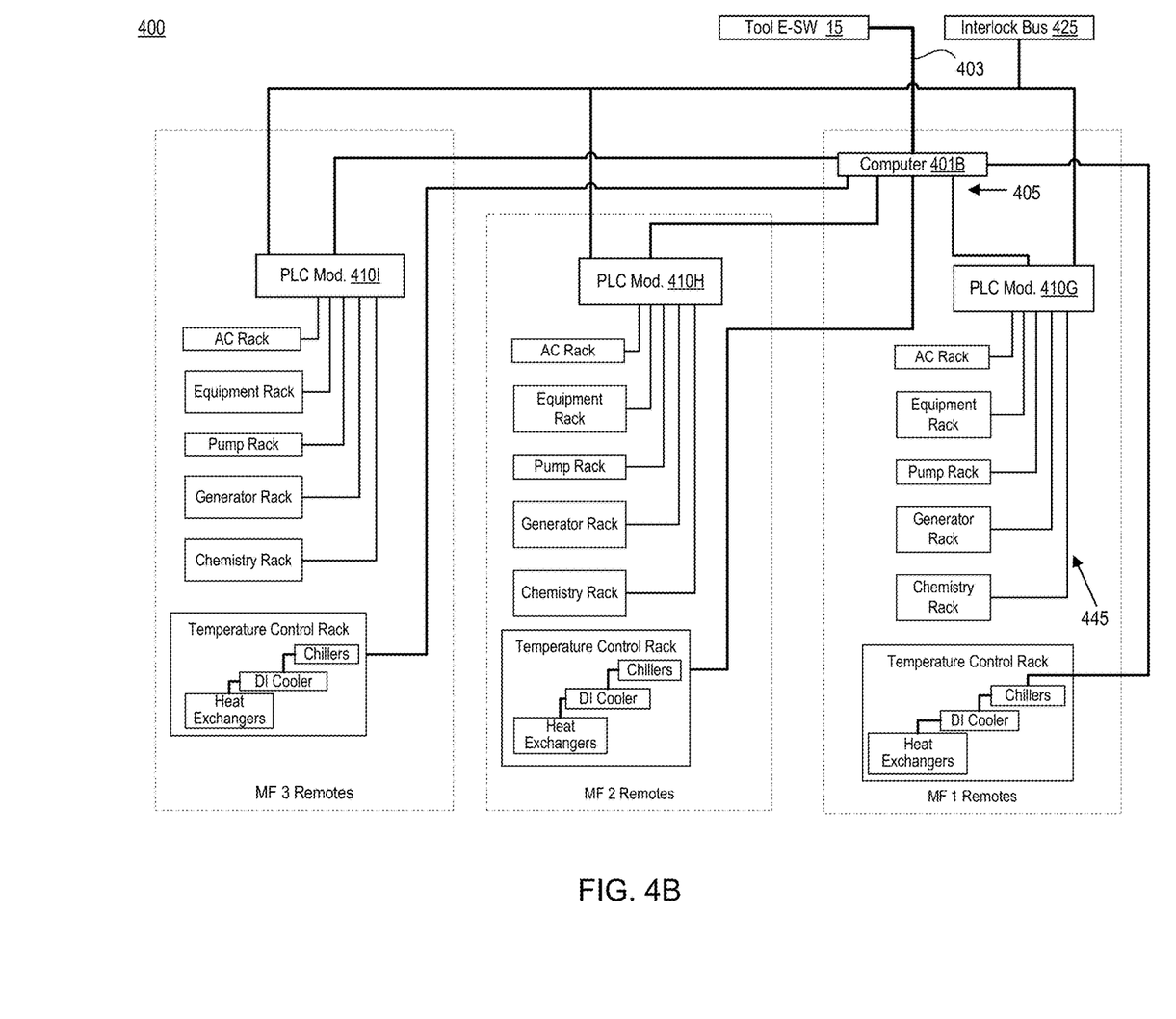
FIG. 4B is a block diagram of mainframe remotes that are extensions to the distributed control and interlock architecture of FIG. 4A.

FIG. 4A is a block diagram of a distributed control and interlock architecture 400 according to various embodiments. FIG. 4B is a block diagram of mainframe remotes that are extensions to the distributed control and interlock architecture 400 of FIG. 4A. In various embodiments, the architecture 400 includes a main tool system 15 coupled to a first computer 401A and a second computer 401B over a computing tool network bus 403. The first computer 401A can be a computing system or device adapted to control and interchange IO control signals with the PLC modules 410A, 410B, and 410C of the three mainframes MF_1, MF_2, and MF_3, respectively, over an EtherCAT network bus 405. The first computer 401A can further be adapted to control PLC modules 410D and 410E of a first factory interface (FI_1) and a second factory interface (FI_2).

The second computer 401B can be a computing system or device adapted to control and interchange IO control signals with three PLC modules 410G, 410H, and 410I of mainframe remotes, namely MF_1 remote, MF_2 remote, and MF_3 remote, respectively, over the EtherCAT network bus 405. In various embodiments, PLC modules 410A . . . 410E can also be interconnected over an interlock bus 425, over which interlocks can directly communicate using a safety protocol or the like.

In some embodiments, each of the PLC modules 410A . . . 410C can be coupled, within each mainframe, to one or more chamber interface IO sub-modules, which are identified by an Interface Control Document (ICD) identifier, and communicate over a local (or chamber interface) IO bus. Each ICD identifier can also indicate connectivity detail between two IO sub-modules. Further, each of the PLC modules 410A . . . 410C can be coupled to, within each mainframe, one or more via controllers, which are identified as a VIA #IOC in FIG. 4A, as well as a via heater (VIA Htr), a transfer chamber IO controller (XFR IOC), an iMFS, a first POU pump, a second POU pump, and a third POU pump. As discussed, these modules are optional and can be flexibly added, e.g., to a local IO bus 425 along with any interface-based assemblies and control modules. Each PLC module 410D and 410E for the factory interface can be coupled to one or more load ports (LP), a fan control, one or more sensors, an IO controller, a light curtain, and other miscellaneous modules.

With additional reference to FIG. 4B, in various embodiments, each of the PLC modules 410G . . . 410I of the mainframe remotes MF_1, MF_2, and MF_3, respectively, is coupled to an AC rack, an equipment rack, a pump rack, a generator rack, a chemistry rack, a temperature control rack, and the like, over a local IO bus 445. In one embodiment, the temperature control rack is coupled to the computer 401B over the EtherCAT network bus 405. The temperature control rack can include, for example, chillers, a digital-in cooler, heat exchangers, and the like. Other modules can be located in a remote area and coupled into the architecture 400 via the EtherCAT network bus 405, the interlock bus 425, or one of the mainframe remotes. Each bus referred to herein can be implemented with a cable consistent with the network type, which could vary depending on the network type industry requirements for connectivity speed, reliability, and the like.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method may be altered so that certain operations may be performed in an inverse order so that certain operations may be performed, at least in part, concurrently with other operations. In another embodiment, instructions or sub-operations of distinct operations may be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A system comprising:
   a programmable logic control (PLC) module;
   an input/output (JO) network bus coupled to the PLC module and provided at a plurality of facets of a mainframe;
   a plurality of network connectors coupled to the I/O network bus and located at the plurality of facets;
   a first process chamber attached to a first facet of the plurality of facets;
   a chamber interface IO sub-module attached to the first facet and coupled to a first network connector of the IO network bus and to a process chamber IO controller of the first process chamber, wherein the chamber interface IO sub-module is to:
   convert interlock relay signals, received via dry contact exchange with the process chamber IO controller, to digital signals;

combine the digital signals into network packets adapted for communication using a protocol of the IO network bus; and transmit the network packets to the PLC module over the IO network bus.

2. The system of claim 1, wherein the PLC module includes a first interlock bus port, further comprising:
a second PLC module of a second mainframe, the second PLC module comprising a second interlock bus port, and wherein the PLC module and the second PLC module are safety PLC modules; and
an interlock connector to couple the first interlock bus port to the second interlock bus port over an interlock bus.

3. The system of claim 1, wherein the IO network bus is a single Ethernet cable to which is attached a plurality of network bus T-connectors, at least one of which is located at each of the plurality of facets.

4. The system of claim 1, further comprising at least one of:
a load lock IO controller coupled to the PLC module over a first local IO bus;
a transfer chamber IO controller coupled to the PLC module over one of the first local IO bus or a second local IO bus; or
a pump IO coupled to the PLC module over one of the first, the second, or a third local IO bus.

5. The system of claim 1, wherein the IO network bus comprises a second plurality of network connectors, the system further comprising a sub-module IO controller attached to one of the second plurality of network connectors, the sub-module IO controller to control one of a load lock heater, an integrated mass flow system, a point-of-use pump, a via slit valve, or a remote control switch.

6. The system of claim 1, further comprising:
a clean dry air (CDA) supply ring positioned around a perimeter of the mainframe and comprising a plurality of CDA quick disconnects located at the plurality of facets; and
a first slit valve assembly coupled to the first facet, the first slit valve assembly comprising:
a chamber slit valve comprising a position sensor; and
an electro-valve (EV) manifold coupled to a CDA quick disconnect of the CDA supply ring and to the chamber slit valve; and
wherein the chamber interface IO sub-module is coupled to the EV manifold and the chamber slit valve, the chamber interface IO sub-module further to relay a position value of the chamber slit valve from the position sensor to the PLC module over the IO network bus.

7. The system of claim 6, wherein the EV manifold comprises one or more EV, and wherein the chamber interface IO sub-module is further to relay a control signal, received over the IO network bus from the PLC module, to the EV manifold to control slit valve pneumatics by driving the one or more EV.

8. The system of claim 6, further comprising additional slit valve assemblies coupled to additional facets, of the plurality of facets, at which additional process chambers are attached to the mainframe.

9. The system of claim 6, wherein the first slit valve assembly further comprises a CDA poly line connected to the EV manifold, wherein the CDA quick disconnect connects the CDA poly line to the CDA supply ring.

10. The system of claim 6, wherein the IO network bus comprises a network connector at the first facet, and wherein the first slit valve assembly further comprises a network drop cable attached to the chamber interface IO sub-module, wherein the network connector connects the network drop cable to the IO network bus.

11. A slit valve assembly comprising:
a chamber slit valve comprising a position sensor;
an electro-valve (EV) manifold comprising an EV coupled to the chamber slit valve;
a clean dry air (CDA) poly line coupled to the EV manifold and to be coupled to a CDA supply ring of a mainframe; and
a chamber interface input/output (IO) sub-module coupled to the position sensor, the EV manifold, and to be coupled to an IO network bus of the mainframe, the chamber interface IO sub-module to:
relay a position value of the chamber slit valve from the position sensor, over the IO network bus, to a programmable logic control (PLC) module of the mainframe; and
relay a control signal, received over the IO network bus from the PLC module, to the EV manifold to control slit valve pneumatics by driving the EV.

12. The slit valve assembly of claim 11, wherein the chamber interface IO sub-module comprises an interlock cable connector that is to be coupled to a process chamber IO controller comprising a plurality of interlock relays, the chamber interface IO sub-module further to:
convert interlock relay signals, received via dry contact exchange with the process chamber IO controller, to digital signals;
combine the digital signals into network packets adapted for communication using a protocol of the IO network bus; and
transmit the network packets to the PLC module over the IO network bus.

13. The slit valve assembly of claim 11, wherein the chamber interface IO sub-module further comprises an interface connector that is to receive an emergency off (EMO) cable, which is coupled to an EMO switch of a process chamber, wherein the chamber interface IO sub-module is further to:
convert an EMO signal, received via dry contact exchange with the EMO switch, to a digital EMO signal;
convert the digital EMO signal into a network packet adapted for communication using a protocol of the IO network bus; and
send the network packet to the PLC module.

14. The slit valve assembly of claim 11, further comprising a control cable coupled between the position sensor and the chamber interface IO sub-module.

15. The slit valve assembly of claim 11, further comprising a network drop cable coupled between the chamber interface IO sub-module and the IO network bus.

16. The slit valve assembly of claim 11, further comprising a service slit valve coupled to the EV manifold and comprising a second position sensor, the second position sensor coupled to the chamber interface IO sub-module, wherein the EV manifold is a four-position EV manifold to control both the chamber slit valve and the service slit valve.

17. A system comprising:
a first safety programmable logic control (PLC) module comprising multiple local input/output (IO) ports and a first interlock bus port;
a first single local IO bus coupled to a first local IO port of the multiple local IO ports;
multiple IO sub-modules coupled to the first single local IO bus, wherein each IO sub-module of the multiple IO sub-modules is to perform an interlock handshake with the first safety PLC module over the first single local IO bus;
a second safety PLC module comprising multiple local IO ports and a second interlock bus port; and
an interlock connector to couple the first interlock bus port to the second interlock bus port over an interlock bus.

18. The system of claim 17, wherein the multiple IO sub-modules comprise a first set of IO sub-modules of a first machine, the system further comprising:
a second single local IO bus coupled to a second local IO port of multiple local IO ports of the second safety PLC module; and
a second set of IO sub-modules, of a second machine, coupled to the second single IO bus.

19. The system of claim 18, further comprising:
a first PLC controller of the first safety PLC module to control IO devices via the first set of IO sub-modules over the first single local IO bus and control IO device via the second set of IO sub-modules over the interlock bus and the second single local IO bus; and
a second PLC controller of the second safety PLC module to control IO devices via the second set of IO sub-modules over the second single local IO bus and control IO devices via the first set of IO sub-modules over the interlock bus and the first single local IO bus.

20. The system of claim 18,
wherein the first safety PLC module comprises:
a first Ethernet for Control Automation Technology (EtherCAT)-in port coupled to an EtherCAT master device over a first EtherCAT network cable; and
a first EtherCAT-out port;
wherein the second safety PLC module comprises a second EtherCAT-in port coupled to the first EtherCAT-out port over a second EtherCAT network cable; and
further comprising a PLC controller of the second safety PLC module to send a safety control signal to one of the first set of IO sub-modules of the first machine over the second EtherCAT network cable.

* * * * *